United States Patent
Ge et al.

(10) Patent No.: US 9,196,330 B2
(45) Date of Patent: Nov. 24, 2015

(54) MIMICKING MULTI-VOLTAGE DOMAIN WORDLINE DECODING LOGIC FOR A MEMORY ARRAY

(75) Inventors: Shaoping Ge, Raleigh, NC (US);
Chiaming Chai, Chapel Hill, NC (US);
Stephen E. Liles, Raleigh, NC (US);
Lam V. Nguyen, Santa Clara, CA (US);
Jeffrey Herbert Fischer, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 919 days.

(21) Appl. No.: 13/424,833

(22) Filed: Mar. 20, 2012

(65) Prior Publication Data
US 2013/0182514 A1  Jul. 18, 2013

Related U.S. Application Data

(60) Provisional application No. 61/587,214, filed on Jan. 17, 2012.

(51) Int. Cl.
| | |
|---|---|
| *G11C 8/00* | (2006.01) |
| *G11C 8/08* | (2006.01) |
| *G11C 7/12* | (2006.01) |
| *G11C 8/10* | (2006.01) |
| *G11C 7/22* | (2006.01) |

(52) U.S. Cl.
CPC .. *G11C 8/08* (2013.01); *G11C 7/12* (2013.01); *G11C 7/22* (2013.01); *G11C 7/227* (2013.01); *G11C 8/10* (2013.01)

(58) Field of Classification Search
CPC .............. G11C 8/08; G11C 8/10; G11C 7/12; G11C 7/22
USPC ................... 365/230.06, 189.11, 203
See application file for complete search history.

(56) References Cited

U.S. PATENT DOCUMENTS

| | | | |
|---|---|---|---|
| 5,386,150 A | 1/1995 | Yonemoto | |
| 6,018,255 A | 1/2000 | Campardo | |
| 7,492,341 B2 | 2/2009 | Tachibana | |
| 7,755,964 B2 | 7/2010 | Jung | |
| 7,839,682 B2 | 11/2010 | Tran | |
| 2007/0070703 A1* | 3/2007 | Tran et al. | 365/185.22 |
| 2008/0074942 A1* | 3/2008 | Kobayashi | 365/230.03 |
| 2010/0290292 A1* | 11/2010 | Tanizaki et al. | 365/185.22 |
| 2011/0007590 A1 | 1/2011 | Katayama | |
| 2011/0110174 A1 | 5/2011 | Cho et al. | |
| 2012/0188816 A1* | 7/2012 | Kim et al. | 365/171 |

OTHER PUBLICATIONS

International Search Report and Written Opinion—PCT/US2013/021824—ISA/EPO—Mar. 21, 2013.

* cited by examiner

*Primary Examiner* — Toan Le
(74) *Attorney, Agent, or Firm* — Xiaotun Qiu

(57) ABSTRACT

Systems and methods for adaptively mimicking wordline decoding logic for multi-voltage domain memory are disclosed. In one embodiment, the multi-voltage domain memory includes a memory array implemented in a high voltage domain and a multi-voltage domain control circuit. The multi-voltage domain control circuit includes multi-voltage domain decoding logic that generates a wordline for the memory array and a multi-voltage domain mimic logic that mimics the multi-voltage domain decoding logic to generate a dummy wordline. In one embodiment, the dummy wordline is utilized to trigger an ending edge (e.g., a falling edge) of the wordline once the wordline is asserted. In addition or alternatively, the dummy wordline is utilized to generate one or more control signals for the memory array such as, for example, a pre-charge control signal and/or a sense amplifier enable signal.

19 Claims, 5 Drawing Sheets

MIMICKING MULTI-VOLTAGE DOMAIN WORDLINE DECODING LOGIC FOR A MEMORY ARRAY

PRIORITY CLAIM

The present application claims priority to U.S. Patent Provisional Application Ser. No. 61/587,214 filed on Jan. 17, 2012 and entitled MIMICING MULTI-VOLTAGE DOMAIN WORDLINE DECODING LOGIC FOR A MEMORY ARRAY, which is incorporated herein by references in its entirety.

FIELD OF THE DISCLOSURE

The present disclosure relates to multi-voltage domain wordline decoding logic for a memory array and more specifically relates to mimicking multi-voltage domain wordline decoding logic for a memory array.

BACKGROUND

Particularly for mobile devices, power consumption is a major issue. Memory is one component for which a reduction in power consumption is desired. Modern low power memory designs typically include multiple voltage domains, which include a low voltage domain for wordline decoding logic and a high voltage domain for the memory array and read and write circuits. Specifically, due to relatively high minimum voltage requirements, the memory array must use a higher supply voltage than what is needed for the wordline decoding logic. As a result of implementing the wordline decoding logic in the low voltage domain, power consumption is reduced.

One issue that arises in multi-voltage domain memory is that device variations in the low voltage domain significantly impact the high voltage domain. More specifically, because devices typically operate much faster in the high voltage domain than in the low voltage domain, timing glitches that result from device variation in the low voltage domain translate to large timing glitches in the high voltage domain. For example, a 50 pico second glitch in the low voltage domain may be considered a relatively small timing glitch, but the same 50 pico second timing glitch in the high voltage domain may be considered a large timing glitch. As a result of device variation and the corresponding timing glitch, control signals for multi-voltage domain memory (e.g., wordlines, pre-charge control signal, sense amplifier enable signal, etc.) may not maintain a stable relationship between one another, which in turn may cause the multi-voltage domain memory to fail. As such, there is a need for systems and methods for maintaining a stable relationship between control signals in multi-voltage domain memory.

SUMMARY OF THE DISCLOSURE

Systems and methods for adaptively mimicking wordline decoding logic for multi-voltage domain memory are disclosed. In one embodiment, the multi-voltage domain memory includes a memory array implemented in a high voltage domain and a multi-voltage domain control circuit. The multi-voltage domain control circuit includes multi-voltage domain decoding logic that generates a wordline for the memory array and a multi-voltage domain mimic logic that mimics the multi-voltage domain decoding logic to generate a dummy wordline. Preferably, the multi-voltage domain control circuit includes multiple multi-voltage domain decoding logic circuits each configured to generate a corresponding wordline for the memory array, and the multi-voltage domain mimic logic mimics the multiple multi-voltage domain decoding logic circuits.

In one embodiment, the dummy wordline is utilized to trigger an ending edge (e.g., a falling edge) of the wordline once the wordline is asserted. In addition or alternatively, the dummy wordline is utilized to generate one or more control signals for the memory array such as, for example, a pre-charge control signal and/or a sense amplifier enable signal.

In one embodiment, the multi-voltage domain decoding logic includes low voltage domain decoding logic, high voltage domain decoding logic, and final decoding logic configured to combine and level-shift outputs of the low voltage domain decoding logic and the high voltage domain decoding logic to generate the wordline. The multi-voltage domain mimic logic includes low voltage domain mimic logic configured to mimic the low voltage domain decoding logic, high voltage domain mimic logic configured to mimic the high voltage domain decoding logic, and final mimic logic configured to mimic the final decoding logic by combining and level-shifting outputs of the low voltage domain mimic logic and the high voltage domain mimic logic to generate the dummy wordline. By generating the dummy wordline using both the low voltage domain mimic logic and the high voltage domain mimic logic, the multi-voltage domain mimic logic generates the dummy wordline such that the dummy wordline tracks the wordline generated by the multi-voltage domain decoding logic. Using the dummy wordline, stable relationships between the wordline and/or control signals for the memory array can be maintained.

BRIEF DESCRIPTION OF THE FIGURES

FIG. 1 is a block diagram of multi-voltage domain memory according to one embodiment of the present disclosure;

FIG. 2 is a circuit diagram for an exemplary embodiment of the pre-decoding logic level shifter of FIG. 1 according to one embodiment of the present disclosure;

FIG. 3 is a circuit diagram for an exemplary embodiment of one of the multi-voltage domain decoding logic circuits of FIG. 1 according to one embodiment of the present disclosure;

FIG. 4 is a circuit diagram for an exemplary embodiment of the multi-voltage domain mimic logic of FIG. 1 according to one embodiment of the present disclosure; and FIG. 5 is a circuit diagram for an exemplary embodiment of the control logic of FIG. 1 according to one embodiment of the present disclosure.

DETAILED DESCRIPTION

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Systems and methods for adaptively mimicking wordline decoding logic for multi-voltage domain memory are disclosed. In one embodiment, the multi-voltage domain memory includes a memory array implemented in a high voltage domain and a multi-voltage domain control circuit. The multi-voltage domain control circuit includes multi-voltage domain decoding logic that generates a wordline for the memory array and a multi-voltage domain mimic logic that mimics the multi-voltage domain decoding logic to generate a dummy wordline. Preferably, the multi-voltage domain control circuit includes multiple multi-voltage domain decoding logic circuits each configured to generate a corresponding wordline for the memory array, and the multi-voltage domain mimic logic mimics the multiple multi-voltage domain decoding logic circuits. In one embodiment, the dummy wordline is utilized to trigger an ending edge (e.g., a falling edge) of the wordline once the wordline is asserted. In addition or alternatively, the dummy wordline is utilized to generate one or more control signals for the memory array such as, for example, a pre-charge control signal and/or a sense amplifier enable signal.

Figure 1:
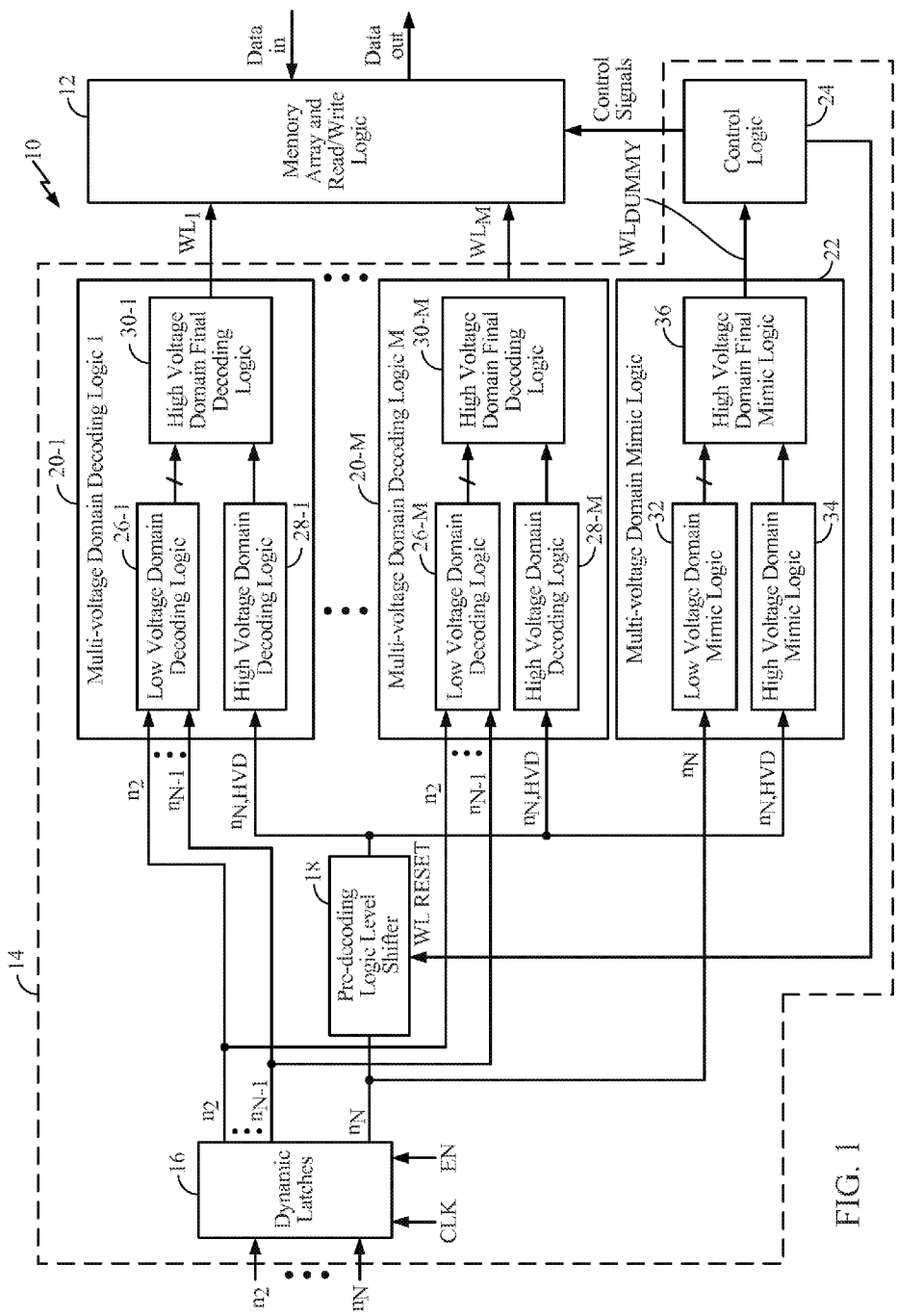

FIG. 1 is a block diagram of multi-voltage domain memory 10 according to one embodiment of the present disclosure. As illustrated, the multi-voltage domain memory 10 includes a memory array and corresponding read and write logic, which is hereinafter simply referred to as a memory array 12, and a multi-voltage domain control circuit 14. The memory array 12 is implemented in the high voltage domain. The multi-voltage domain control circuit 14 is implemented in multiple voltage domains. In general, the multi-voltage domain control circuit 14 receives a number of index bits, which in this example are index bits $n_2$ through $n_N$, and outputs a number of wordlines $WL_1$ through $WL_M$ to the memory array 12, where M is $2^{N-1}$. Notably, in this example, the memory array 12 is a 4-to-1 memory, or a four-way set associative memory, where index bits $n_o$ and $n_1$ are used to index one of the four ways, which may be represented as columns, of the memory array 12. However, the present disclosure is not limited thereto. In addition, as discussed below, the multi-voltage domain control circuit 14 preferably provides one or more control signals to the memory array 12.

As illustrated, the multi-voltage domain control circuit 14 includes a number of dynamic latches 16, a pre-decoding logic level shifter 18, a number of multi-voltage domain decoding logic circuits 20-1 through 20-M, multi-voltage domain mimic logic 22, and a control logic 24 connected as shown. The dynamic latches 16 operate in the low voltage domain. In operation, the dynamic latches 16 dynamically latch the index bits $n_2$ through $n_N$ when both a clock signal (CLK) and a latch enable signal (EN) are asserted. In the preferred embodiment discussed herein, the dynamic latches 16 output both true and complement values for each of the latched index bits $n_2$ through $n_N$ when both the clock signal (CLK) and the latch enable signal (EN) are asserted. When either or both of the clock signal (CLK) and the latch enable signal (EN) are not asserted, the dynamic latches 16 set both the true and complement values for the latched index bits $n_2$ through $n_N$ to a default value, which in the preferred embodiment described herein is logic 0.

The pre-decoding logic level shifter 18 generally receives a single latched index bit, which in the preferred embodiment described herein is the latched index bit $n_N$. The pre-decoding logic level shifter 18 level-shifts the latched index bit $n_N$ from the low voltage domain to the high voltage domain. As used herein, the low voltage domain is a domain of the multi-voltage domain memory 10 that utilizes a first, relatively low supply voltage whereas the high voltage domain is a domain of the multi-voltage domain memory 10 that utilizes a second, relatively high supply voltage. The supply voltage for the low voltage domain is lower than the supply voltage for the high voltage domain (e.g., the supply voltage for the low voltage domain may be 3 Volts (V) and the supply voltage for the high voltage domain may be 5 V).

The multi-voltage domain decoding logic circuits 20-1 through 20-M include corresponding low voltage domain decoding logic circuits 26-1 through 26-M, high voltage domain decoding logic circuits 28-1 through 28-M, and high voltage domain final decoding logic circuits 30-1 through 30-M, respectively. The multi-voltage domain decoding logic circuits 20-1 through 20-M are generally referred to herein collectively as multi-voltage domain decoding logic circuits 20 and individually as multi-voltage domain decoding logic 20. Likewise, the low voltage domain decoding logic circuits 26-1 through 26-M are generally referred to herein collectively as low voltage domain decoding logic circuits 26 and individually as low voltage domain decoding logic 26, the high voltage domain decoding logic circuits 28-1 through 28-M are generally referred to herein collectively as high voltage domain decoding logic circuits 28 and individually as high voltage domain decoding logic 28, and the high voltage domain final decoding logic circuits 30-1 through 30-M are generally referred to herein collectively as high voltage domain final decoding logic circuits 30 and individually as high voltage domain final decoding logic 30.

The low voltage domain decoding logic 26 generally receives the latched index bits $n_2$ through $n_{N-1}$ from the dynamic latches 16 and processes the latched index bits $n_2$ through $n_{N-1}$ in the low voltage domain to provide a number of output signals. The high voltage domain decoding logic 28 generally receives the level-shifted index bit $n_{N,HVD}$ from the pre-decoding logic level shifter 18 and processes the level-shifted index bit $n_{N,HVD}$ in the high voltage domain to provide an output signal. The final decoding logic 30 receives the outputs from the low voltage domain decoding logic 26 and the high voltage domain decoding logic 28 and processes the outputs from the low voltage domain decoding logic 26 and the high voltage domain decoding logic 28 to provide the corresponding wordline (WL). In general, the multi-voltage domain decoding logic 20 operates to assert the corresponding wordline (WL) when the latched index bits $n_2$ through $n_N$ match an index of the corresponding wordline (WL).

The multi-voltage domain mimic logic 22 generally operates to mimic the multi-voltage domain decoding logic 20 to thereby generate a dummy wordline ($WL_{DUMMY}$). By mimicking the multi-voltage domain decoding logic 20, the multi-voltage domain mimic logic 22 generates the dummy wordline ($WL_{DUMMY}$) such that the dummy wordline ($WL_{DUMMY}$) tracks the wordlines ($WL_1$ through $WL_M$) (i.e., rising and falling edges of the dummy wordline ($WL_{DUMMY}$) are time-aligned with rising and falling edges of the asserted wordline (WL) indexed by the index bits $n_2$ through $n_N$).

As illustrated, the multi-voltage domain mimic logic 22 includes low voltage domain mimic logic 32 that mimics the low voltage domain decoding logic 26, high voltage domain mimic logic 34 that mimics the high voltage domain decoding logic 28, and high voltage domain final mimic logic 36 that mimics the high voltage domain final decoding logic 30. More specifically, the low voltage domain mimic logic 32 receives true and complement values for one of the latched index bits, which in this preferred embodiment is the latched index bit $n_N$. The low voltage domain mimic logic 32 processes the true and complement values for the latched index bit $n_N$ in the low voltage domain to generate an output signal. The high voltage domain mimic logic 34 receives true and complement values for the level-shifted index bit $n_N$ and processes those true and complement values in the high voltage domain to generate an output signal. The final mimic logic 36 processes the output signals from the low voltage domain mimic logic 32 and the high voltage domain mimic logic 34 to generate the dummy wordline ($WL_{DUMMY}$).

In operation, initially when the clock signal (CLK) and/or the dynamic latch enable signal (EN) are de-asserted, both the true and complement values for the latched index bit $n_N$ are set to a default logic value, which in the preferred embodiment is logic 0. At this point, the multi-voltage domain mimic logic 22 forces the dummy wordline ($WL_{DUMMY}$) to logic 0. Thereafter, when the clock signal (CLK) and the dynamic latch enable signal (EN) are both asserted, either the true value or the complement value for the latched index bit $n_N$ flips from the default logic value to the opposite logic value (e.g., flips from logic 0 to logic 1) as a result of latching the index bit $n_N$ input into the corresponding dynamic latch 16. In response, the multi-voltage domain mimic logic 22 mimics the multi-voltage domain decoding logic 20 to thereby assert the dummy wordline ($WL_{DUMMY}$). Because the multi-voltage domain mimic logic 22 is triggered by the flip in state of either the true value or the complement value of the latched index bit $n_N$, the multi-voltage domain mimic logic 22 asserts the dummy wordline ($WL_{DUMMY}$) regardless of which of the wordlines ($WL_1$ through $WL_M$) is asserted in response to the latched index bits $n_2$ through $n_N$.

As discussed below in detail, the control logic 24 utilizes the dummy wordline ($WL_{DUMMY}$) to trigger an ending edge, which in this preferred embodiment is the falling edge, of the wordline ($WL_1$ through $WL_M$) asserted in response to the latched index bits $n_2$ through $n_N$ and generate control signals for the memory array 12 (e.g., a pre-charge control signal for pre-charging bit lines for the memory array 12 for read and/or write operations, a sense amplifier enable signal for enabling sense amplifier(s) in the memory array 12 during read operations, or the like). By using the dummy wordline ($WL_{DUMMY}$), stable relationships are maintained between the wordlines ($WL_1$ through $WL_M$) and the control signals for the memory array 12 in the multi-voltage domain memory 10.

Figure 2:
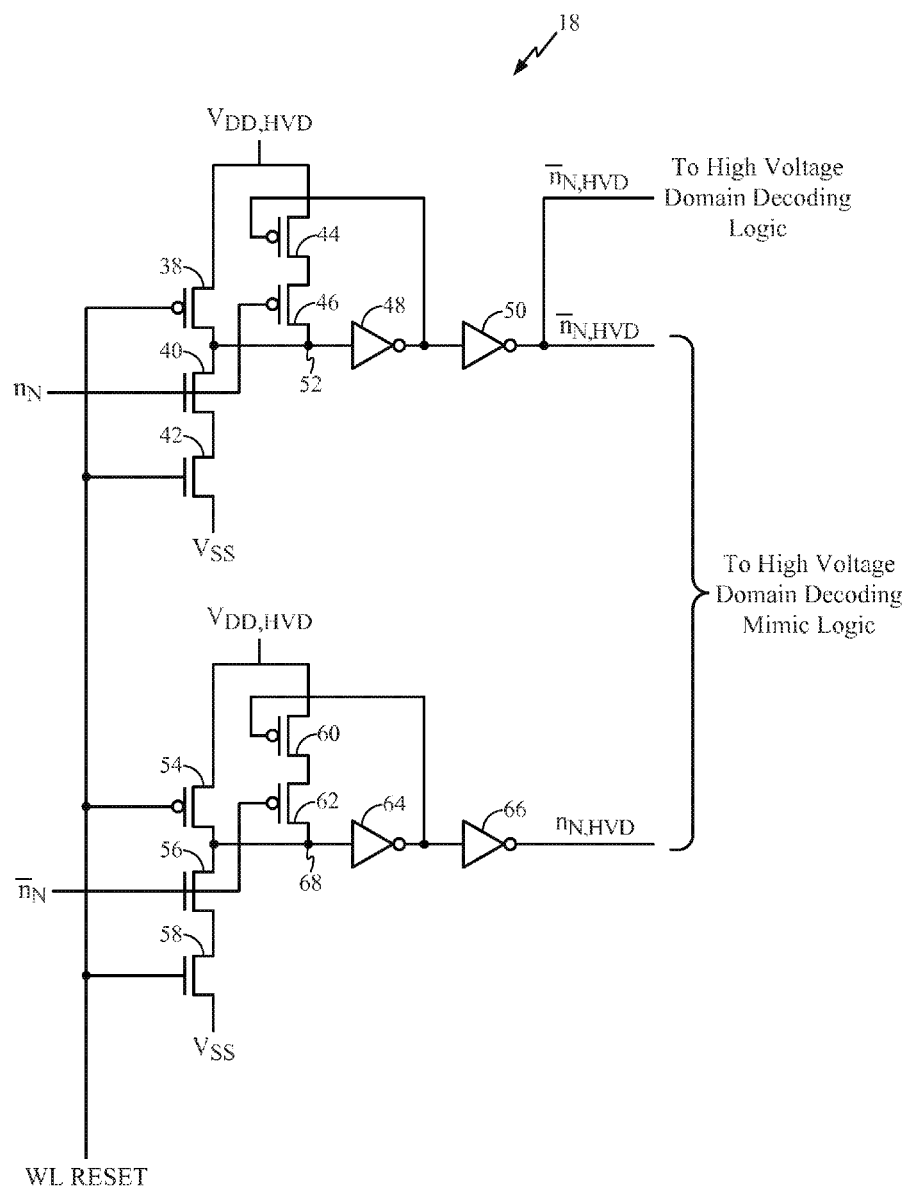

FIG. 2 is a circuit diagram of an exemplary embodiment of the pre-decoding logic level shifter 18 of FIG. 1. As illustrated, the pre-decoding logic level shifter 18 includes a true branch that includes transistors 38 through 46 and inverters 48 and 50 connected as shown. In general, the true branch receives the true value of the index bit $n_N$ as its input and then level-shifts and, in this embodiment, inverts the true value of the index bit $n_N$ to provide a level-shifted complement value for the index bit $n_N$, which is denoted $\bar{n}_{N,HVD}$. More specifically, if the true value for the index bit $n_N$ is logic 1 and a wordline reset control signal (WL RESET) is at logic 1 which as discussed below is its deasserted state, the transistors 38 and 46 are off and the transistors 40 and 42 are on. Note that the transistor 44 is on due to a prior wordline reset. As a result, an internal node 52 is pulled to $V_{SS}$, which represents logic 0. The logic 0 at the internal node 52 is then passed through the inverters 48 and 50 to provide the level-shifted complement value for the index bit $n_N$ ($\bar{n}_{N,HVD}$), which in this case is logic 0. Conversely, if the true value for the index bit $n_N$ is logic 0 and the wordline reset control signal (WL RESET) is at logic 1 which as discussed below is its deasserted state, the transistors 38 and 40 are off and the transistors 42, 44, and 46 are on. As a result, the internal node 52 is pulled to the supply voltage for the high voltage domain ($V_{DD,HVD}$), which represents logic 1 in the high voltage domain. Note that the transistor 44 is on due to a prior wordline reset which forces the output of the inverter 48 to logic 0. The logic 1 at the internal node 52 is then passed through the inverters 48 and 50 to provide the level-shifted complementary value for the index bit $n_N$ ($\bar{n}_{N,HVD}$), which in this case is logic 1 for the high voltage domain.

The pre-decoding logic level shifter 18 also includes a complement branch that includes transistors 54 through 62 and inverters 64 and 66 connected as shown. In general, the complement branch receives the complement value for the index bit $n_N$, which is denoted herein as $\bar{n}_N$, as its input and then level-shifts and, in this embodiment, inverts the complement value for the index bit $n_N$ ($\bar{n}_N$) to provide a level-shifted true value for the index bit $n_N$, which is denoted $n_{N,HVD}$. More specifically, if the complement value for the index bit $n_N$ is logic 1 and a wordline reset control signal (WL RESET) is at logic 1 which as discussed below is its deasserted state, the transistors 54 and 62 are off and the transistors 56 and 58 are on. Note that the transistor 60 is on due to a prior wordline reset. As a result, an internal node 68 is pulled to $V_{SS}$, which represents logic 0. The logic 0 at the internal node 68 is then passed through the inverters 64 and 66 to provide the level-shifted true value for the index bit $n_N$ ($n_{N,HVD}$), which in this case is logic 0. Conversely, if the complement value for the index bit $n_N$ ($\bar{n}_N$) is logic 0 and the wordline reset control signal (WL RESET) is at logic 1 which as discussed below is its deasserted state, the transistors 54 and 56 are off and the transistors 58, 60, and 62 are on. As a result, the internal node 68 is pulled to the supply voltage for the high voltage domain ($V_{DD,HVD}$), which represents logic 1 in the high voltage domain. Note that the transistor 60 is on due to a prior wordline reset which forces the output of the inverter 64 to logic 0. The logic 1 at the internal node 68 is then passed through the inverters 64 and 66 to provide the level-shifted true value for the index bit $n_N$ ($n_{N,HVD}$), which in this case is logic 1 for the high voltage domain.

Lastly, when the wordline reset control signal (WL RESET) is asserted low, the transistors 38 and 54 are on and the transistors 42 and 58 are off. As a result, the internal nodes 52 and 68 are pulled to the supply voltage for the high voltage domain ($V_{DD,HVD}$) regardless of the state of the true and complement values for the index bit $n_N$. As a result, the level-shifted true and complement values $n_{N,HVD}$ and $\bar{n}_{N,HVD}$ are both forced to logic 1 for the high voltage domain, which, as discussed below, forces all of the wordlines ($WL_1$ through $WL_M$) as well as the dummy wordline ($WL_{DUMMY}$) low (i.e., deasserts all real wordlines and the dummy wordline).

Figure 3:
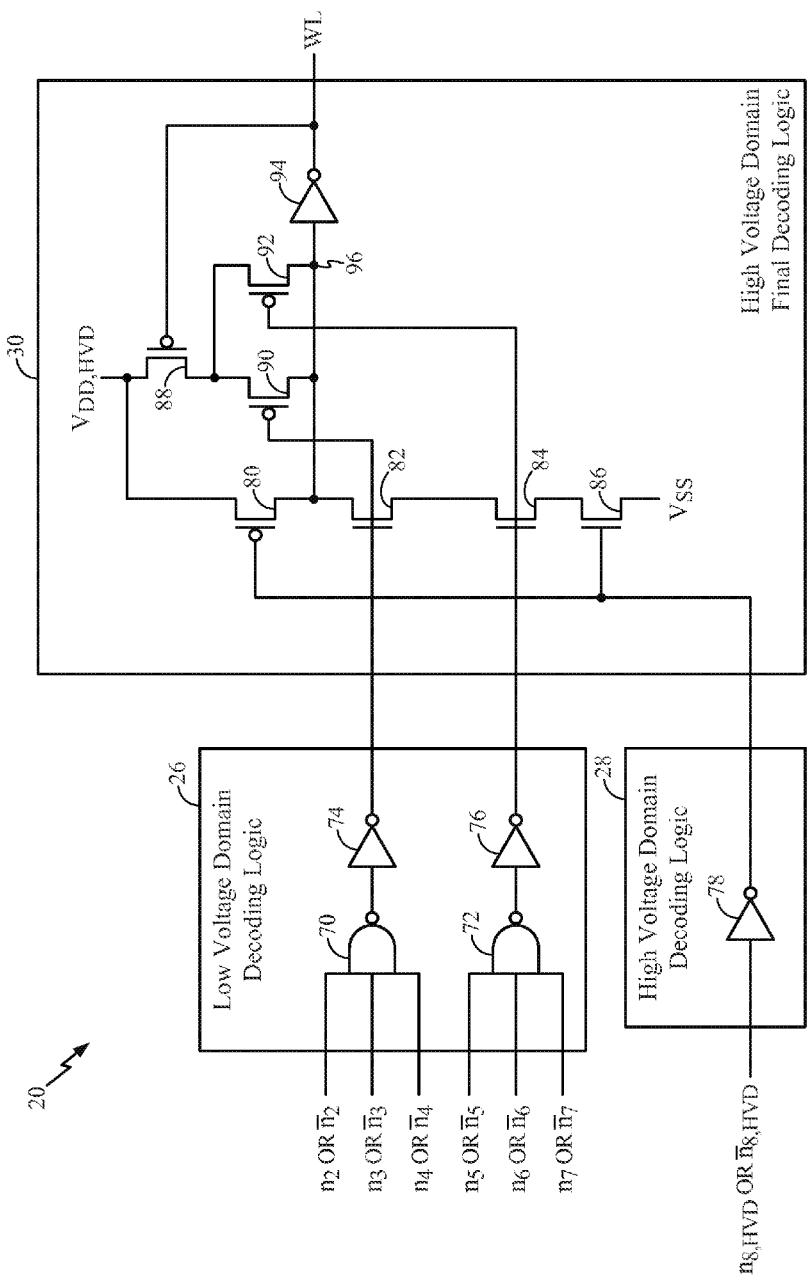

FIG. 3 is a circuit diagram of an exemplary embodiment of the multi-voltage domain decoding logic 20. Note that this discussion is equally applicable to all of the multi-voltage domain decoding logic circuits 20-1 through 20-M. In this exemplary embodiment, there are nine index bits $n_0$ through $n_8$, where index bits $n_2$ through $n_8$ are used for wordline decoding and index bits $n_0$ and $n_1$ are used for way or column selection in the memory array 12 which in this example is four-way set associative.

As illustrated, the low voltage domain decoding logic 26 includes a pair of NAND gates 70 and 72 and a pair of inverters 74 and 76. The low voltage domain decoding logic 26 performs an initial decoding process for index bits $n_2$ through $n_7$ in the low voltage domain. Specifically, in this embodiment, depending on the particular wordline to be generated (i.e., $WL_1$, $WL_2$, ..., or $WL_M$ where in this example M=128), the NAND gates 70 and 72 receive either the true or the complement values for the index bits $n_2$ through $n_7$ from the dynamic latches 16 and generate corresponding output signals. For example, if the wordline (WL) generated by the multi-voltage domain decoding logic 20 is to be asserted high when the index bits $n_2$ through $n_8$ are all logic 0 (i.e., the index for $WL_1$ is 0000000), then the inputs to the NAND gates 70 and 72 would be the complement values for the index bits $n_2$ through $n_7$. Conversely, if the wordline (WL) generated by the multi-voltage domain decoding logic 20 is to be asserted high when the index bits $n_2$ through $n_8$ are all logic 1 (i.e., the index for $WL_1$ is 1111111), then the inputs to the NAND gates 70 and 72 would be the true values for the index bits $n_2$ through $n_7$. As a final example, if the wordline (WL) generated by the multi-voltage domain decoding logic 20 is to be asserted high when the index bits $n_2$ through $n_8$ are 0111111, respectively, then the inputs to the NAND gates 70 and 72 would be the complement value for the index bit $n_2$ and the true values for the index bits $n_3$ through $n_7$.

Specifically, in this example, the NAND gate 70 receives as its inputs either the true or the complement values for the index bits $n_2$ through $n_4$ and generates a corresponding output signal, which is logic 0 if all of the inputs to the NAND gate 70 are logic 1 and is otherwise logic 1. Similarly, the NAND gate 72 receives as its inputs either the true or the complement values for the index bits $n_5$ through $n_7$ and generates a corresponding output signal, which is logic 0 if all of the inputs to the NAND gate 72 are logic 1 and is otherwise logic 1. The outputs of the NAND gates 70 and 72 are inverted by the inverters 74 and 76 to provide corresponding outputs of the low voltage domain decoding logic 26. In general, the outputs of the low voltage domain decoding logic 26 are high when the values for the index bits $n_2$ through $n_7$ match the corresponding bits of the index for the wordline (WL) generated by the multi-voltage domain decoding logic 20. Otherwise, the outputs of the low voltage domain decoding logic 20 are low.

The high voltage domain decoding logic 28 operates in the high voltage domain. The high voltage domain decoding logic 28 includes an inverter 78 that receives as its input either the true or complement value of the level-shifted index bit $n_8$ ($n_{8,HVD}$ or $\bar{n}_{8,HVD}$) from the pre-decoding logic level shifter 18 of FIG. 2. Notably, depending on the index of the particular wordline (WL) generated by the multi-voltage domain decoding logic 20, the input of the inverter 78 is either the true or the complement value for the level-shifted index bit $n_8$ ($n_8$ or $\bar{n}_{8,HVD}$) from the pre-decoding logic level shifter 18. For example, if the wordline (WL) generated by the multi-voltage domain decoding logic 20 is to be asserted high when the index bits $n_2$ through $n_8$ are all logic 0 (i.e., the index for $WL_1$ is 0000000), then the input to the inverter 78 is the true value of the level-shifted index bit $n_8$ ($n_{8,HVD}$). Conversely, if the wordline (WL) generated by the multi-voltage domain decoding logic 20 is to be asserted high when index bits $n_2$ through $n_8$ are all logic 1 (i.e., the index for $WL_1$ is 1111111), then the input to the inverter 78 is the complement value of the level-shifted index bit $n_8$ ($\bar{n}_{8,HVD}$). In general, the output of the high voltage domain decoding logic 28 is logic 1 if the index bit $n_8$ matches the corresponding bit of the index for the wordline (WL) generated by the multi-voltage domain decoding logic 20 and is otherwise logic 0.

The final decoding logic 30 operates in the high voltage domain. In general, the final decoding logic 30 receives as its inputs the two outputs from the low voltage domain decoding logic 26 and the output from the high voltage domain decoding logic 28 and then processes theses inputs to generate the wordline (WL). In this embodiment, the wordline (WL) is asserted high when the two outputs of the low voltage domain decoding logic 26 and the output of the high voltage domain decoding logic 28 are all logic 1 and otherwise is deasserted low. More specifically, in this embodiment, the final decoding logic 30 includes transistors 80 through 92 and an inverter 94 connected as shown. When the two outputs of the low voltage domain decoding logic 26 and the output of the high voltage domain decoding logic 28 are all logic 1, the transistors 80, 90, and 92 are all off and the transistors 82, 84, and 86 are all on. As a result, an internal node 96 of the final decoding logic 30 is pulled to the low reference voltage ($V_{SS}$), which represents logic 0. The logic 0 at the internal node 96 is then inverted by the inverter 94 to thereby assert the wordline (WL) high (i.e., to logic 1). Conversely, if any one or more of the two outputs of the low voltage domain decoding logic 26 and the output of the high voltage domain decoding logic 28 is logic 0, the internal node 96 is pulled to the supply voltage ($V_{DD,HVD}$) for the high voltage domain, which represents logic 1. The logic 1 at the internal node 96 is then inverted by the inverter 94 to deassert the wordline (WL) low (i.e., to logic 0).

Figure 4:
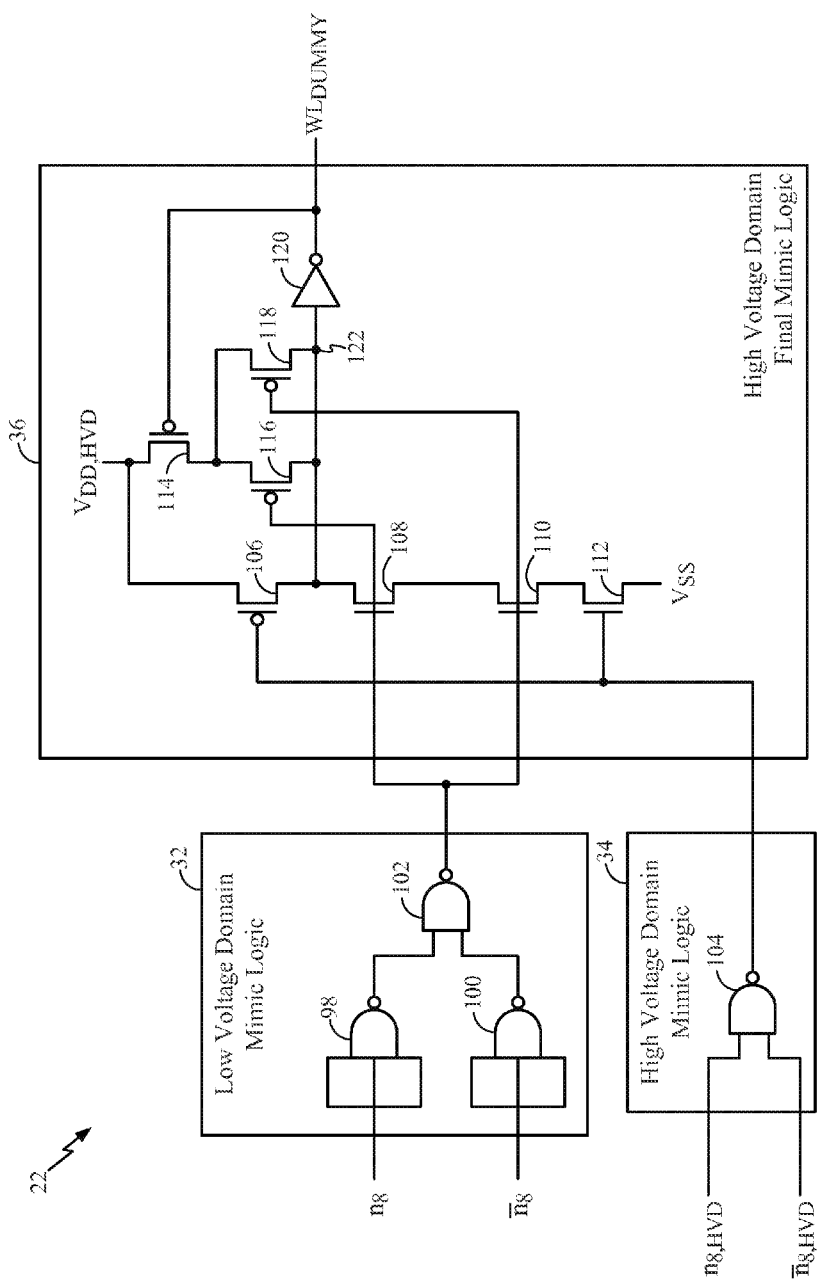

FIG. 4 is a circuit diagram of an exemplary embodiment of the multi-voltage domain mimic logic 22 that mimics the multi-voltage domain decoding logic 20 of FIG. 3 to provide the dummy wordline ($WL_{DUMMY}$) according to one embodiment of the present disclosure. As discussed above, the multi-voltage domain mimic logic 22 includes the low voltage domain mimic logic 32 that mimics the low voltage domain decoding logic 26, the high voltage domain mimic logic 34 that mimics the high voltage domain decoding logic 28, and the final mimic logic 36 that mimics the final decoding logic 30. In this particular embodiment, the low voltage domain mimic logic 32 includes NAND gates 98, 100, and 102 connected as shown. The NAND gate 98 mimics the NAND gate 70 of the low voltage domain decoding logic 26, the NAND gate 100 mimics the NAND gate 72 of the low voltage domain decoding logic 26, and the NAND gate 102 mimics the inverter 74 and 76 of the low voltage domain decoding logic 26.

Like the NAND gates 70 and 72, the NAND gates 98 and 100 each have three inputs. However, each of the three inputs of the NAND gate 98 is connected to the true value of the index bit $n_8$ from the corresponding dynamic latch 16, and each of the three inputs of the NAND gate 100 is connected to the complement value of the index bit $n_8$ ($\bar{n}_8$) from the corresponding dynamic latch 16. In operation, initially when the clock signal (CLK) and/or the dynamic latch enable signal (EN) are deasserted (e.g., low), both the true and the complement values for each of the index bits $n_2$ through $n_8$ output by the dynamic latches 16 is logic 0. When both the clock signal (CLK) and the dynamic latches enable signal (EN) are subsequently asserted (e.g., high), the dynamic latches 16 latch the index bits $n_2$ through $n_8$ input to the dynamic latches 16 to output true and complement values for the index bits $n_2$ through $n_8$. Therefore, at that point, either the true value or the complement value for the index bit $n_8$ will flip from the default state of logic 0 to logic 1. This flip triggers the operation of the low voltage domain mimic logic 32 (as well as the operation of the high voltage domain mimic logic 34).

More specifically, initially when the clock signal (CLK) and/or the dynamic latch enable signal (EN) are deasserted (e.g., low), both the true and the complement values for the index bit $n_8$ output by the corresponding dynamic latch 16 are logic 0. As such, the NAND gates 98 and 100 both output logic 1. The NAND gate 102 receives the outputs of the NAND gates 98 and 100 as its inputs and therefore outputs logic 0 when both the output of the NAND gate 98 and the output of the NAND gate 100 are logic 1. This keeps node $WL_{DUMMY}$ to logic 0 through pullup transistor 106, which is a PMOS transistor that is forced on by the NAND gate 104 when the clock signal (CLK) and/or the dynamic latch enable signal (EN) are deasserted. However, once the clock signal (CLK) and the dynamic latch enable signal (EN) are asserted high, either the true value or the complement value of the index bit $n_8$ flips from the default value of logic 0 to logic 1. At that point, the output of either the NAND gate 98 or the NAND gate 100 will be logic 0 while the output of the other one of the NAND gates 98 and 100 will be logic 1. In response to the logic 0 and logic 1 inputs from the NAND gates 98 and 100, the NAND gate 102 outputs logic 1. In this manner, the low voltage domain mimic logic 32 outputs logic 1 each time the low voltage domain decoding logic 26 of any one of the multi-voltage domain decoding logic circuits 20 outputs all logic 1's, which as discussed below results in the dummy wordline ($WL_{DUMMY}$) tracking any one of the wordlines ($WL_1$ through $WL_M$) that is asserted.

The high voltage domain mimic logic 34 includes a NAND gate 104 that mimics the inverter 78 of the high voltage domain decoding logic 28. In operation, the NAND gate 104 receives both the level-shifted true value for the index bit $n_8$ ($n_{8,HVD}$) and the level-shifted complement value for the index bit $n_8$ ($\bar{n}_{8,HVD}$). Initially when the clock signal (CLK) and/or the dynamic latch enable signal (EN) are deasserted (e.g., low), both the true and the complement values for the index bit $n_8$ output by the corresponding dynamic latch 16 are logic 0. As a result, both the level-shifted true value for the index bit $n_8$ ($n_{8,HVD}$) and the level-shifted complement value for the index bit $n_8$ ($\bar{n}_{8,HVD}$) are logic 1. As such, the NAND gate 104 outputs logic 0, which in turn forces the pullup transistor 106 on. By forcing the pullup transistor 106 on, $WL_{DUMMY}$ is forced to logic 0. However, once the clock signal (CLK) and the dynamic latch enable signal (EN) are asserted high, either the true value or the complement value of the index bit $n_8$ flips from the default value of logic 0 to logic 1. As a result, one of the level-shifted true value for the index bit $n_8$ ($n_{8,HVD}$) and the level-shifted complement value for the index bit $n_8$ ($\bar{n}_{8,HVD}$) flips from logic 1 in the high voltage domain to logic 0. At that point, the inputs to the NAND gate 104 are logic 0 and logic 1. As such, the output of NAND gate 104 is logic 1. In this manner, the high voltage domain mimic logic 34 outputs logic 1 each time the high voltage domain decoding logic 28 of any one of the multi-voltage domain decoding logic circuits 20 outputs logic 1, which as discussed below results in the dummy wordline ($WL_{DUMMY}$) tracking any one of the wordlines ($WL_1$ through $WL_M$) that is asserted.

The final mimic logic 36 mimics the final decoding logic 30 of the multi-voltage decoding logic 20. In this particular embodiment, the final mimic logic 36 has the same circuit arrangement as the final decoding logic 30. More specifically, the final mimic logic 36 includes transistors 106 through 118 and an inverter 120 connected as shown. When both the output of the low voltage domain mimic logic 32 and the output of the high voltage domain mimic logic 34 are logic 0, the transistors 108, 110, and 112 are off and the transistors 106, 114, 116, and 118 are on such that an internal node 122 is pulled to the supply voltage for the high voltage domain ($V_{DD,HVD}$), which represents logic 1. The logic 1 at the internal node 122 is inverted by the inverter 120 to deassert the dummy wordline ($WL_{DUMMY}$) low. Conversely, when both the output of the low voltage domain mimic logic 32 and the output of the high voltage domain mimic logic 34 are logic 1, the transistors 106, 116, and 118 are off and the transistors 108, 110, and 112 are on such that the internal node 122 of the final mimic logic 36 is pulled to the low reference voltage ($V_{SS}$), which represents logic 0. The logic 0 at the internal node 122 is inverted by the inverter 120 to assert the dummy wordline ($WL_{DUMMY}$) high.

Because the outputs of the low voltage domain mimic logic 32 and the high voltage domain mimic logic 34 are driven high in response the flip in the state of either the true or the complement value of the index bit $n_8$ from the default logic 0 to logic 1, the outputs of both the low voltage domain mimic logic 32 and the high voltage domain mimic logic 34 are asserted high when the outputs of both the low voltage domain decoding logic 26 and the high voltage domain decoding logic 28 of any one of the multi-voltage domain decoding logic circuits 20 are asserted high. As a result, the final mimic logic 36 asserts the dummy wordline ($WL_{DUMMY}$) when any one of the multi-voltage domain decoding logic circuits 20 asserts its corresponding wordline (WL).

Figure 5:
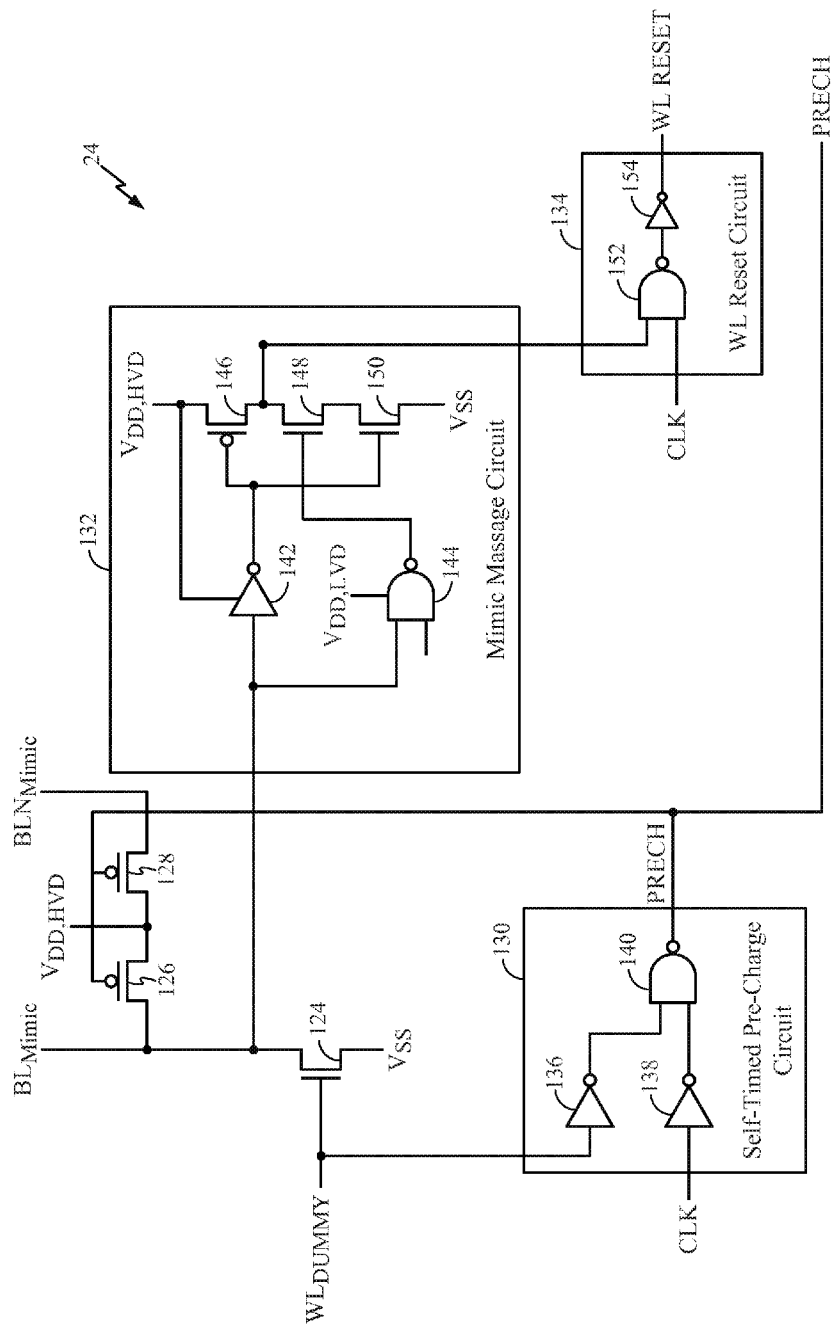

FIG. 5 is an exemplary circuit diagram for the control logic 24 of FIG. 1 according to one embodiment of the present disclosure. In general, the control logic 24 triggers a falling edge of asserted wordlines (WL) and generates one or more control signals for the memory array 12 based on the dummy wordline ($WL_{DUMMY}$). As discussed below, the control logic 24 generates a pre-charge control signal (PRECH) that is provided to the memory array 12 to control pre-charging of bit lines in the memory array 12 for read and/or write operations. In addition, the control logic 24 may pass the dummy wordline ($WL_{DUMMY}$) to the memory array 12, where the memory array 12 generates a sense amplifier enable signal based on the dummy wordline ($WL_{DUMMY}$). Alternatively, the control logic 24 may generate the sense amplifier enable signal based on the dummy wordline ($WL_{DUMMY}$) and provide the sense amplifier enable signal to the memory array 12.

In this embodiment, the control logic 24 includes a transistor 124 that mimics a read operation for the memory array 12, a pair of transistors 126 and 128 that mimic a pre-charge operation in which bit lines of the memory array 12 are pre-charged prior to a read or write operation, a pre-charge circuit 130, a mimic massage circuit 132, and a wordline (WL) reset circuit 134 connected as shown. The pre-charge circuit 130 generally operates to assert an output of the pre-charge circuit 130, which is referred to herein as a pre-charge control signal (PRECH), low when the dummy wordline ($WL_{DUMMY}$) and the clock signal (CLK) are low (i.e., are logic 0) and otherwise deasserts the output of the pre-charge circuit 130 high. Here, the pre-charge control signal (PRECH) is used internally by the control logic 24. However, the pre-charge control signal (PRECH) is preferably also provided to the memory array 12 to control pre-charging of the bit lines in the memory array 12 for read and/or write operations.

As illustrated, the pre-charge circuit 130 includes inverters 136 and 138 and a NAND gate 140 connected as shown. The inverter 136 inverts the dummy wordline ($WL_{DUMMY}$) to provide a first input of the NAND gate 140, and the inverter 138 inverts the clock signal (CLK) to provide a second input of the NAND gate 140. As such, when the dummy wordline ($WL_{DUMMY}$) and the clock signal (CLK) are both low, both of the inputs of the NAND gate 140 are high. As a result, the pre-charge control signal (PRECH) output by the NAND gate 140 is asserted low. Otherwise, the pre-charge control signal (PRECH) output by the NAND gate 140 is deasserted high.

When the pre-charge circuit 130 asserts the pre-charge control signal (PRECH) low, the transistors 126 and 128 are turned on such that mimic bit lines ($BL_{MIMIC}$ and $BLN_{MIMIC}$) are pre-charged to the supply voltage for the high voltage domain ($V_{DD,HVD}$), which represents logic 1 in the high voltage domain. In this embodiment, the mimic bit line ($BL_{MIMIC}$) is connected to an input of the mimic massage circuit 132. When the pre-charge control signal (PRECH) is subsequently deasserted high as a result of either the clock signal (CLK) or the dummy wordline ($WL_{DUMMY}$) going high, pre-charging is complete. When the dummy wordline ($WL_{DUMMY}$) is asserted high by the multi-voltage domain mimic logic 22, the transistor 124, which is also referred to herein as a read operation mimic transistor, is turned on. When the transistor 124 is turned on, the mimic bit line ($BL_{MIMIC}$), and thus the input to the mimic massage circuit 132, is discharged to logic 0.

The mimic massage circuit 132 has an input connected to the mimic bit line ($BL_{MIMIC}$) and generates an output that is logic 1 when the input is logic 1. However, when the input to the mimic massage circuit 132 is logic 0, the output of the mimic massage circuit 132 transitions to logic 0 after an additional dynamic delay is added by the mimic massage circuit 132. The additional dynamic delay is a function of the supply voltage for the low voltage domain ($V_{DD,LVD}$) and generally increases as the supply voltage for the low voltage domain ($V_{DD,LVD}$) decreases. As illustrated, in this embodiment, the mimic massage circuit 132 includes an inverter 142 that is in the high voltage domain (i.e., supply voltage of $V_{DD,HVD}$), a NAND gate 144 that is in the low voltage domain (i.e., supply voltage of $V_{DD,LVD}$), and transistors 146, 148, and 150 that are in the high voltage domain connected as shown. In operation, when the input of the mimic massage circuit 132 is logic 1, the input is inverted by the inverter 142 to provide logic 0 to the gates of the transistors 146 and 150. As a result, the transistor 146 is on such that the output of the mimic massage circuit 132 is pulled to the supply voltage for the high voltage domain ($V_{DD,HVD}$), which represents logic 1 in the high voltage domain. Conversely, when the input of the mimic massage circuit 132 is logic 0, the input is inverted by the inverter 142 to provide logic 1 to the gates of the transistors 146 and 150. As a result, the transistor 146 is off and the transistor 150 is on. In addition, the input of the mimic massage circuit 132 is provided to a first input of the NAND gate 144. While the inverter 142 is in high voltage domain, the NAND gate 144 is in the low voltage domain. As such, when the input of the mimic massage circuit 132 is low, the output of the NAND gate 144 transitions to logic 1. However, the speed of this transition is a function of the supply voltage for the low voltage domain ($V_{DD,LVD}$). Specifically, as the supply voltage for the low voltage domain ($V_{DD,LVD}$) decreases, the amount of time needed to transition the output of the NAND gate 144 to logic 1 increases. Once the output of the NAND gate 144 has transitioned to logic 1, the transistor 148 is turned on. At that point, the transistor 146 is off and the transistors 148 and 150 are on. As a result, the output of the mimic massage circuit 132 is pulled low (i.e., pulled to logic 0). Notably, the amount of time needed for the transition of the output of the NAND gate 144 from logic 0 to logic 1 when the input of the mimic massage circuit 132 is logic 0 is the additional delay introduced by the mimic massage circuit 132.

Notably, one input of the NAND gate 144 is connected to the input of the mimic massage circuit 132, which is also the input of the inverter 142. The other input of the NAND gate 144 is normally a logic 1. In this case, the NAND gate 144 operates like an inverter. However, when the high voltage domain is turned off to, for example, conserve power, the input of the mimic massage circuit 132 will be floating. If the low voltage domain is still one, there may be a leaking path from the low voltage supply to ground. In this case, the other input of the NAND gate 144 can be forced to a logic low (e.g., ground) to cut the this leaking path. Thus, in sum, the other input of the NAND gate 144 is used to clamp the floating voltage domain to avoid leaking paths in the voltage domain that is on. This give the high and low voltage domains freedom to be on or off independently.

The wordline (WL) reset circuit 134 generally operates to provide the wordline (WL) reset control signal (WL RESET) to the pre-decoding logic level shifter 18 (FIGS. 1 and 2). More specifically, in this embodiment, the wordline (WL) reset circuit 134 includes a NAND gate 152 and an inverter 154 connected as shown. The NAND gate 152 has a first input connected to the output of the mimic massage circuit 132 and a second input that receives the clock signal (CLK). The output of the NAND gate 152 is connected to the input of the inverter 154. In operation, the wordline (WL) reset circuit 134 asserts the WL reset control signal (WL RESET) low when the output of the mimic massage circuit 132 and/or the clock signal (CLK) are low. Otherwise, if both the output of the mimic massage circuit 132 and the clock signal (CLK) are high, then the wordline (WL) reset control signal (WL RESET) is deasserted high. When the wordline (WL) reset control signal (WL RESET) is asserted low, all of the wordlines ($WL_1$ through $WL_M$) and the dummy wordline ($WL_{DUMMY}$) are forced low. In other words, the wordline (WL) reset control signal (WL RESET) triggers a falling edge of the asserted wordline (WL) and the dummy wordline ($WL_{DUMMY}$).

The control logic 24 of FIG. 5 operates as follows. Initially, the clock signal (CLK) is deasserted and the dummy wordline ($WL_{DUMMY}$) is at its default value of logic 0. At this point, while the clock signal (CLK) and the dummy wordline ($WL_{DUMMY}$) are both logic 0, the pre-charge circuit 130 asserts the pre-charge control signal (PRECH) low, thereby activating the transistors 126 and 128 such that the mimic bit line ($BL_{MIMIC}$) and thus the input of the mimic massage circuit 132 is charged to logic 1 for the high voltage domain. Thereafter, when the clock signal (CLK) transitions to its high phase (i.e., transitions to logic 1), the pre-charge circuit 130 deasserts the pre-charge control signal (PRECH). In addition, as discussed above, assuming that the dynamic latch enable signal (EN) is also asserted, the assertion of the clock signal (CLK) triggers latching of the index bits $n_2$ through $n_N$ by the dynamic latches 16. The multi-voltage domain decoding logic circuits 20 then operate to assert the appropriate wordline (WL), and the multi-voltage domain mimic logic 22 mimics the multi-voltage domain decoding logic circuits 20 to assert the dummy wordline ($WL_{DUMMY}$) such that the dummy wordline ($WL_{DUMMY}$) tracks the asserted wordline (WL). In other words, the starting edge (e.g., the rising edge) and the ending edge (e.g., the falling edge) of the dummy wordline ($WL_{DUMMY}$) are time-aligned, or at least substantially time-aligned, with corresponding starting and ending edges of the asserted wordline (WL). Once the dummy wordline ($WL_{DUMMY}$) is asserted high, the transistor 124 is activated such that the mimic bit line ($BL_{MIMIC}$) and thus the input of the mimic massage circuit 132 is pulled to logic 0.

Once the input of the mimic massage circuit 132 is pulled to logic 0, the mimic massage circuit 132 operates to pull the output of the mimic massage circuit 132 to logic 0, but with an additional delay that is a function of the supply voltage for the low voltage domain ($V_{DD,LVD}$). Thus, there is a delay between the time that the dummy wordline ($WL_{DUMMY}$) is asserted and the transition of the output of the mimic massage circuit 132 to logic 0. This delay includes an amount of time required for the transistor 124 to discharge the input of the mimic massage circuit 132 to logic 0 plus the amount of time required for the NAND gate 144 or the inverter 142 (whichever is slower) to transition its output from logic 0 to logic 1 in response to discharging of the input of the mimic massage circuit 132 to logic 0.

Once the output of the mimic massage circuit 132 is pulled low, the wordline (WL) reset circuit 134 forces all of the wordlines ($WL_1$ to $WL_M$) and the dummy wordline ($WL_{DUMMY}$) low, thereby triggering a falling edge of the asserted wordline (WL) and the dummy wordline ($WL_{DUMMY}$). The delay between the time that the dummy wordline ($WL_{DUMMY}$) is asserted and the time that the output of the mimic massage circuit 132 is pulled low defines a duration of a pulse of the asserted wordline (WL) indexed by the index bits $n_2$ through $n_N$. Preferably, the additional delay introduced by the mimic massage circuit 132 provides sufficient margin for read and write operations in the memory array 12. However, it should be noted that the additional delay, and thus the mimic massage circuit 132, is optional and may not be desired in some applications.

Those of skill in the art would further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The embodiments of the multi-voltage domain memory 10 described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, a base station, or a server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps \may be subject to numerous different modifications as will be readily apparent to one of skill in the art. Those of skill in the art would also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multi-voltage domain control circuit for a memory array comprising:
    multi-voltage domain decoding logic configured to generate a wordline for the memory array;
    multi-voltage domain mimic logic configured to mimic the multi-voltage domain decoding logic to generate a dummy wordline;
    the multi-voltage domain decoding logic comprising:
        low voltage domain decoding logic;
        high voltage domain decoding logic; and
        high voltage domain final decoding logic configured to combine and level-shift outputs of the low voltage domain decoding logic and the high voltage domain decoding logic to generate the wordline; and
    the multi-voltage domain mimic logic comprising:
        low voltage domain mimic logic configured to mimic the low voltage domain decoding logic;
        high voltage domain mimic logic configured to mimic the high voltage domain decoding logic; and
        high voltage domain final mimic logic configured mimic the high voltage domain final decoding logic to combine and level-shift outputs of the low voltage domain mimic logic and the high voltage domain mimic logic to generate the dummy wordline.

2. The multi-voltage domain control circuit of claim 1 wherein the low voltage domain decoding logic generates one or more output signals based on a comparison of a first subset of a plurality of index bits for the multi-voltage domain decoding logic and corresponding bits of an index of the wordline generated by the multi-voltage domain decoding logic, and the high voltage domain decoding logic generates one or more output signals based on a comparison of a second subset of the plurality of index bits for the multi-voltage domain decoding logic and corresponding bits of the index of the wordline generated by the multi-voltage domain decoding logic.

3. The multi-voltage domain control circuit of claim 2 wherein the high voltage domain final decoding logic asserts the wordline when the one or more output signals of the low voltage domain decoding logic and the one or more output signals of the high voltage domain decoding logic indicate that the plurality of index bits match the index of the wordline generated by the multi-voltage domain decoding logic.

4. The multi-voltage domain control circuit of claim 3 wherein the first subset of the plurality of index bits is all but one bit of the plurality of index bits, and the second subset of the plurality of index bits is the one bit of the plurality of index bits not in the first subset of the plurality of index bits.

5. The multi-voltage domain control circuit of claim 4 further comprising a pre-decoding logic level shifter configured to level-shift the one bit of the plurality of index bits from a low voltage domain to a high voltage domain and provide a resulting level-shifted index bit as an input to the high voltage domain decoding logic and an input of the high voltage domain mimic logic.

6. The multi-voltage domain control circuit of claim 5 wherein the low voltage domain mimic logic generates an output signal based on true and complement values of the one bit of the plurality of index bits, the high voltage domain mimic logic generates an output signal based on true and complement values of the level-shifted index bit, and the high voltage domain final mimic logic generates the dummy wordline based on the output of the low voltage domain mimic logic and the output of the high voltage domain mimic logic.

7. The multi-voltage domain control circuit of claim 6 wherein the first subset of the plurality of index bits are not used as inputs to the multi-voltage domain mimic logic.

8. The multi-voltage domain control circuit of claim 6 wherein the multi-voltage domain mimic logic deasserts the dummy wordline when the true and complement values for the one of the plurality of index bits and thus the true and complement values of the level-shifted index bit are all set to a same default logic value and asserts the dummy wordline when either the true or complement value of the one of the plurality of index bits and thus either the true or complement value of the level-shifted index bit transitions from the default logic value to an opposite logic value.

9. The multi-voltage domain control circuit of claim 1 wherein the multi-voltage domain decoding logic asserts the wordline when a plurality of index bits input to the multi-voltage domain decoding logic match an index for the wordline, and the multi-voltage domain mimic logic generates the dummy wordline such that the dummy wordline mimics the wordline asserted by the multi-voltage domain decoding logic.

10. The multi-voltage domain control circuit of claim 9 wherein assertion of the dummy wordline triggers an ending edge of the wordline asserted by the multi-voltage domain decoding logic.

11. The multi-voltage domain control circuit of claim 10 wherein triggering of the ending edge of the wordline is delayed with respect to the assertion of the dummy wordline.

12. The multi-voltage domain control circuit of claim 9 wherein:
assertion of the dummy wordline triggers an ending edge of the wordline asserted by the multi-voltage domain decoding logic; and
a pre-charge control signal that controls pre-charging of bit lines of the memory array is generated based on the dummy wordline.

13. The multi-voltage domain control circuit of claim 9 wherein:
assertion of the dummy wordline triggers an ending edge of the wordline asserted by the multi-voltage domain decoding logic; and
a sense amplifier enable signal for the memory array is generated based on the dummy wordline.

14. The multi-voltage domain control circuit of claim 9 wherein:
assertion of the dummy wordline triggers an ending edge of the wordline asserted by the multi-voltage domain decoding logic;

a pre-charge control signal that controls pre-charging of bit lines of the memory array is generated based on the dummy wordline; and
a sense amplifier enable signal for the memory array is generated based on the dummy wordline.

15. The multi-voltage domain control circuit of claim 1 wherein a pre-charge control signal that controls pre-charging of bit lines of the memory array is generated based on the dummy wordline.

16. The multi-voltage domain control circuit of claim 1 wherein a sense amplifier enable signal for the memory array is generated based on the dummy wordline.

17. A method of operation of a multi-voltage domain control circuit for a memory array comprising:
decoding a plurality of index bits via a multi-voltage domain decoding logic to generate a wordline for the memory array;
mimicking the multi-voltage domain decoding logic via multi-voltage domain mimic logic to generate a dummy wordline;
wherein decoding the plurality of index bits via the multi-voltage domain decoding logic to generate the wordline for the memory array comprises:
decoding a first subset of the plurality of index bits via low voltage domain decoding logic to provide one or more output signals of the low voltage domain decoding logic;
decoding a second subset of the plurality of index bits via high voltage domain decoding logic to provide one or more output signals of the high voltage domain decoding logic; and
generating the wordline via a high voltage domain final decoding logic based on the one or more output signals of the low voltage domain decoding logic and the one or more output signals of the high voltage domain decoding logic; and
wherein mimicking the multi-voltage domain decoding logic via the multi-voltage domain mimic logic to generate the dummy wordline comprises:
mimicking the low voltage domain decoding logic via low voltage domain mimic logic;
mimicking the high voltage domain decoding logic via high voltage domain mimic logic; and
mimicking the high voltage domain final decoding logic via high voltage domain final mimic logic to generate the dummy wordline based on outputs of the low voltage domain mimic logic and the high voltage domain mimic logic.

18. A multi-voltage domain control circuit for a memory array comprising:
a multi-voltage domain decoding means for decoding a plurality of index bits to generate a wordline for the memory array;
a multi-voltage domain mimicking means for mimicking the multi-voltage domain decoding means to generate a dummy wordline;
the multi-voltage domain decoding means comprising:
a low voltage domain decoding means for decoding a first subset of the plurality of index bits in a low voltage domain to provide one or more first decoding output signals;
a high voltage domain decoding means for decoding a second subset of the plurality of index bits in a high voltage domain to provide one or more second decoding output signals; and a means for generating the wordline based on the one or more first decoding output signals and the one or more second decoding output signals; and the multi-voltage domain mimicking means comprising:
- a low voltage domain mimicking means for mimicking the low voltage domain decoding means;
- a high voltage domain mimicking means for mimicking the high voltage domain decoding logic; and
- a means for generating the dummy wordline in the high voltage domain based on outputs of the low voltage domain mimicking means and the high voltage domain mimicking means.

19. A non-transitory computer readable medium storing software for instructing a multi-voltage domain control circuit for a memory array to:

decode a plurality of index bits via a multi-voltage domain decoding process to generate a wordline for the memory array;

mimic the decoding of the plurality of index bits via a multi-voltage domain mimicking process to generate a dummy wordline;

wherein decoding the plurality of index bits via the multi-voltage domain decoding logic to generate the wordline for the memory array comprises:

decoding a first subset of the plurality of index bits via low voltage domain decoding logic to provide one or more output signals of the low voltage domain decoding logic;

decoding a second subset of the plurality of index bits via high voltage domain decoding logic to provide one or more output signals of the high voltage domain decoding logic; and generating the wordline via a high voltage domain final decoding logic based on the one or more output signals of the low voltage domain decoding logic and the one or more output signals of the high voltage domain decoding logic; and wherein mimicking the multi-voltage domain decoding logic via the multi-voltage domain mimic logic to generate the dummy wordline comprises:

mimicking the low voltage domain decoding logic via low voltage domain mimic logic;

mimicking the high voltage domain decoding logic via high voltage domain mimic logic; and mimicking the high voltage domain final decoding logic via high voltage domain final mimic logic to generate the dummy wordline based on outputs of the low voltage domain mimic logic and the high voltage domain mimic logic.

* * * * *